(12) United States Patent
Miwa

(10) Patent No.: US 11,273,645 B2
(45) Date of Patent: Mar. 15, 2022

(54) BONDING MEMBER, LIQUID DISCHARGE HEAD, LIQUID DISCHARGE DEVICE, AND LIQUID DISCHARGE APPARATUS

(71) Applicant: Ricoh Company, Ltd., Tokyo (JP)

(72) Inventor: Keishi Miwa, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 16/895,788

(22) Filed: Jun. 8, 2020

(65) Prior Publication Data

US 2021/0016568 A1 Jan. 21, 2021

(30) Foreign Application Priority Data

Jul. 20, 2019 (JP) .............................. JP2019-134194

(51) Int. Cl.
*B41J 2/16* (2006.01)
*B41J 2/14* (2006.01)

(52) U.S. Cl.
CPC .... *B41J 2/1623* (2013.01); *B41J 2002/14241* (2013.01); *H01L 2224/83385* (2013.01)

(58) Field of Classification Search
CPC .................................................. B41J 2/1623
See application file for complete search history.

(56) References Cited

U.S. PATENT DOCUMENTS

| 6,361,155 B1 * | 3/2002 | Kanda ................. B41J 2/14274 347/65 |
| 6,729,717 B2 * | 5/2004 | Ito ....................... B41J 2/14209 347/47 |
| 10,744,768 B2 * | 8/2020 | Miwa .................... B41J 2/1646 |
| 2004/0263584 A1 * | 12/2004 | Ito ........................ B41J 2/1623 347/71 |
| 2005/0040581 A1 * | 2/2005 | Ito ....................... B41J 2/14209 270/58.13 |
| 2015/0171307 A1 | 6/2015 | Masuda et al. |
| 2016/0001556 A1 | 1/2016 | Masuda et al. |
| 2017/0100934 A1 | 4/2017 | Masuda et al. |
| 2019/0275796 A1 | 9/2019 | Miwa |

FOREIGN PATENT DOCUMENTS

JP 2018-069654 5/2018

* cited by examiner

*Primary Examiner* — Shelby L Fidler
(74) *Attorney, Agent, or Firm* — Xsensus LLP

(57) ABSTRACT

A bonding member includes a first member, and a second member bonded to the first member with an adhesive in a bonding direction. The first member includes a bonding surface to be bonded to the second member in the bonding direction, and a surface portion lower than the bonding surface in the bonding direction. The surface portion of the first member is bonded to the second member with the adhesive in the bonding direction, and the second member includes a through hole opposed to the surface portion of the first member.

17 Claims, 15 Drawing Sheets

BONDING MEMBER, LIQUID DISCHARGE HEAD, LIQUID DISCHARGE DEVICE, AND LIQUID DISCHARGE APPARATUS

CROSS-REFERENCE TO RELATED APPLICATION

This patent application is based on and claims priority pursuant to 35 U.S.C. § 119(a) to Japanese Patent Application No. 2019-134194, filed on Jul. 20, 2019, in the Japan Patent Office, the entire disclosure of which is hereby incorporated by reference herein.

BACKGROUND

Technical Field

Aspects of the present disclosure relate to a bonding member, a liquid discharge head including the bonding member, a liquid discharge device including the liquid discharge head, and a liquid discharge apparatus including the liquid discharge device.

RELATED ART

A liquid discharge head includes a bonding member (lamination member) in which a nozzle plate, a channel plate, a wall member, a holding substrate (protection member), and a common channel member, for example, are bonded with each other with an adhesive.

The holding substrate includes a leg to confirm a bonding state (adhesion state) of the holding substrate on a substrate with the adhesive when the holding substrate is bonded to the substrate including a plurality of electromechanical transducer elements with the adhesive.

SUMMARY

In an aspect of this disclosure, a bonding member includes a first member, and a second member bonded to the first member with an adhesive in a bonding direction. The first member includes a bonding surface to be bonded to the second member in the bonding direction and a surface portion lower than the bonding surface in the bonding direction. The surface portion of the first member is bonded to the second member with the adhesive in the bonding direction, and the second member includes a through hole opposed to the surface portion of the first member.

BRIEF DESCRIPTION OF THE SEVERAL VIEWS OF THE DRAWINGS

The aforementioned and other aspects, features, and advantages of the present disclosure will be better understood by reference to the following detailed description when considered in connection with the accompanying drawings, wherein.

Figure 1:
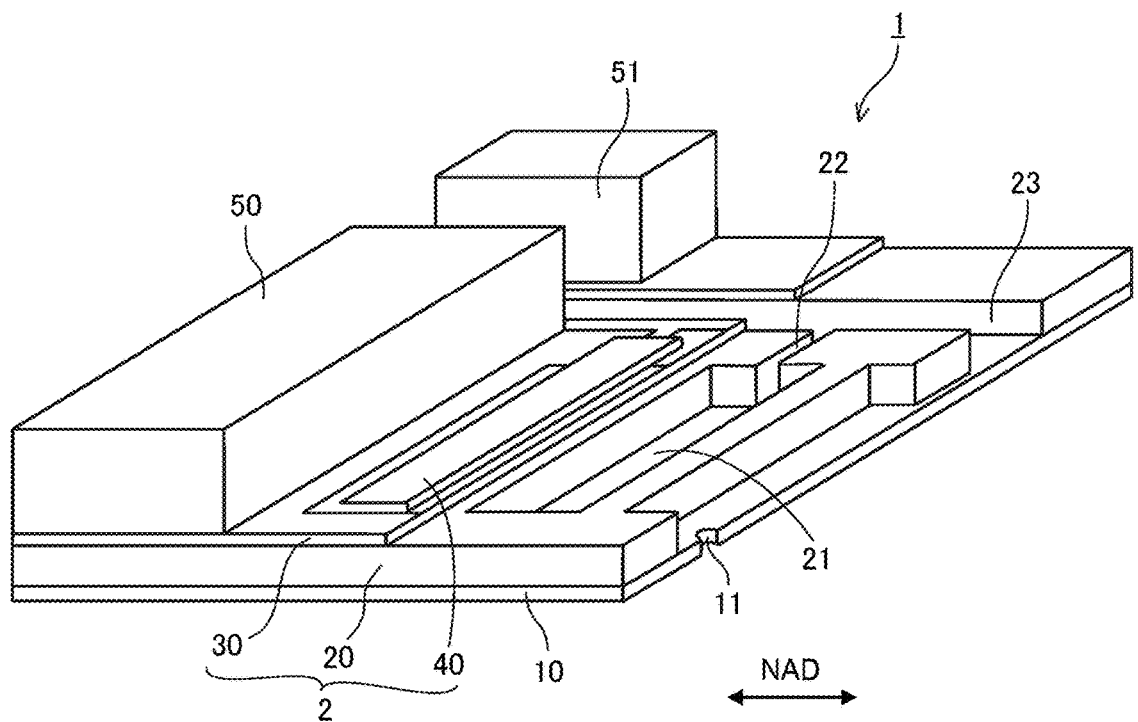
FIG. 1 is an external schematic perspective view of a liquid discharge head according to a first embodiment of the present disclosure.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that have the same function, operate in a similar manner, and achieve similar results.

Although the embodiments are described with technical limitations with reference to the attached drawings, such description is not intended to limit the scope of the disclosure and all of the components or elements described in the embodiments of this disclosure are not necessarily indispensable. As used herein, the singular forms "a," "an," and "the" are intended to include the plural forms as well, unless the context clearly indicates otherwise.

Figure 2:
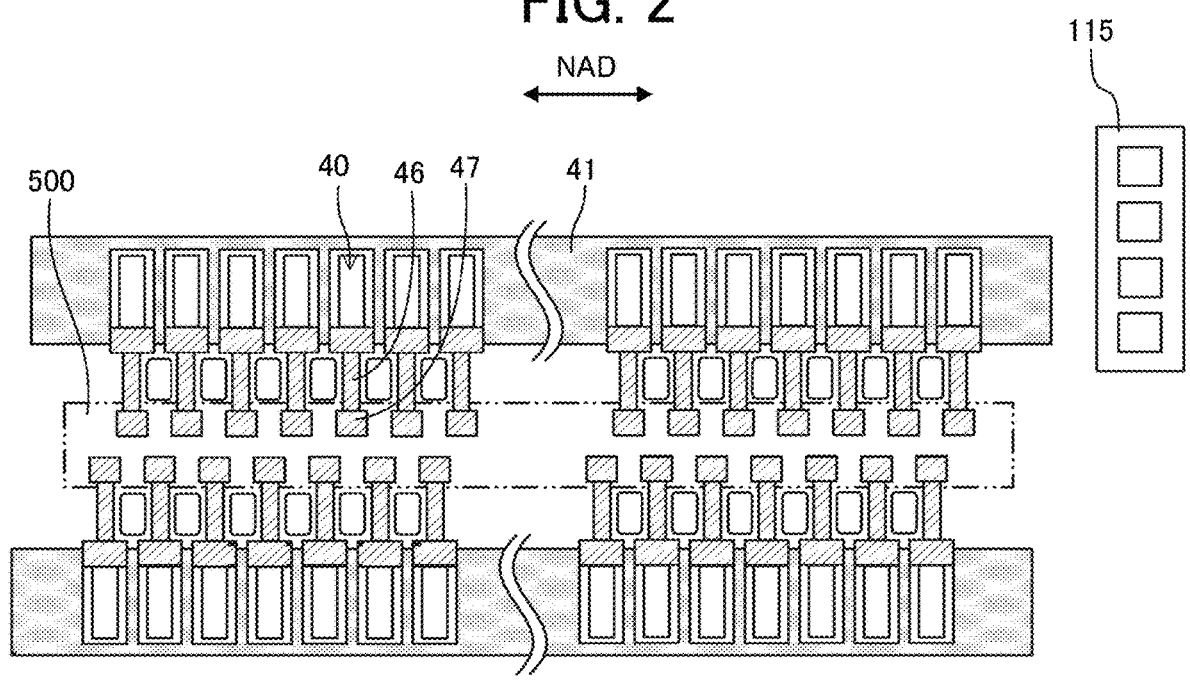
FIG. 2 is a schematic plan view of the liquid discharge head of FIG. 1.
Figure 3:
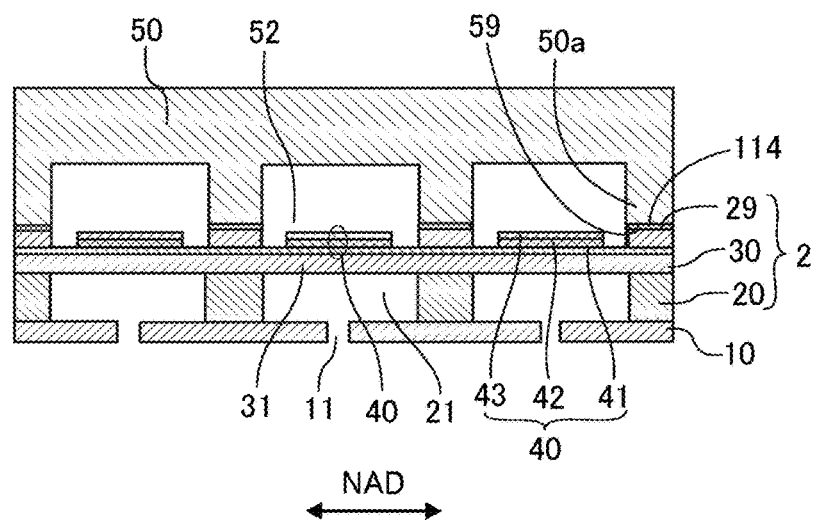
FIG. 3 is a cross-sectional view of a portion of the liquid discharge head of FIG. 2 along a nozzle array direction NAD.
Figure 4:
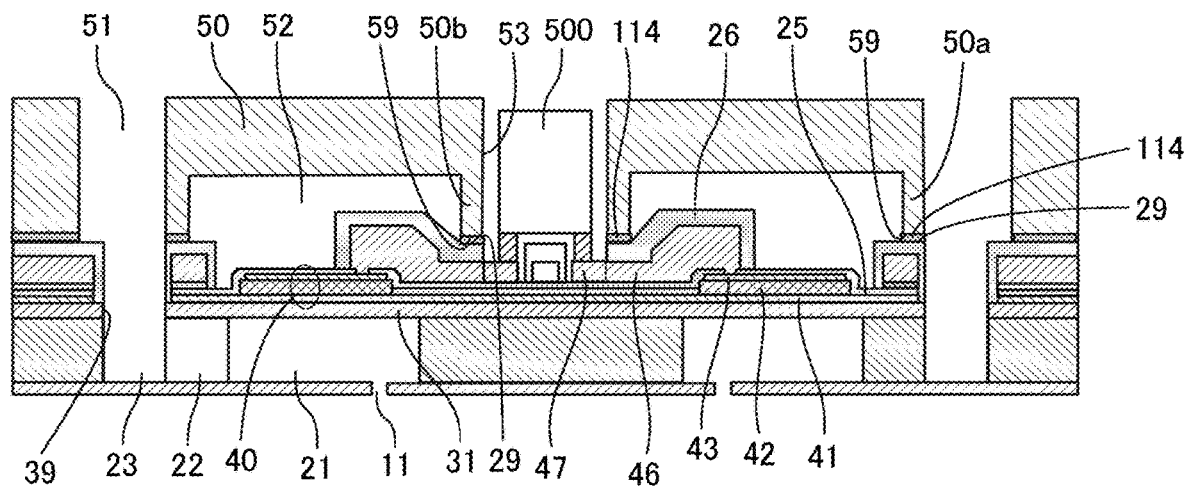
FIG. 4 is a cross-sectional view of the liquid discharge head of FIG. 1 along a direction perpendicular to the nozzle array direction NAD.

Embodiments of the present disclosure are described below with reference to the attached drawings. A liquid discharge head 1 according to a first embodiment of the present disclosure is described with reference to FIGS. 1 to 4. Hereinafter, the "liquid discharge head" is simply referred to as the "head." FIG. 1 is an external schematic perspective view of the head 1 according to the first embodiment of the present disclosure. FIG. 2 is a schematic plan view of the head 1 of FIG. 1. FIG. 3 is a schematic cross-sectional view of a portion of the head 1 of FIG. 1 along a nozzle array direction indicated by arrow "NAD" in which nozzles 11 are arrayed in row. FIG. 4 is a cross-sectional view of the head 1 of FIG. 1 along a direction perpendicular to the nozzle array direction NAD.

The head 1 includes a nozzle plate 10, a channel plate 20, a diaphragm 30 as a wall, piezoelectric elements 40 as pressure generating elements, a holding substrate 50 (protective substrate or supply channel substrate), and the like.

Here, a portion constituted by the channel plate 20, the diaphragm 30, and the piezoelectric elements 40 serves as an actuator substrate 2.

The nozzle plate 10 includes a plurality of nozzles 11 to discharge a liquid. The head 1 in the first embodiment include two rows of nozzle arrays in each of which the nozzles 11 are arrayed in row.

The channel plate 20 together with the nozzle plate 10 and the diaphragm 30 form a pressure chamber 21 communicating with the nozzle 11, an individual supply channel 22 also serving as a fluid restrictor communicating with the pressure chamber 21, and an intermediate supply channel 23 communicating with two or more individual supply channels 22.

The intermediate supply channel 23 communicates with a common channel formed by a common-channel member through an opening 39 (see FIG. 4) in the diaphragm 30 and an opening 51 (see FIGS. 1 and 4) in the holding substrate 50. The opening 51 of the holding substrate 50 may communicate with all the intermediate supply channels 23 to form a part of the common channel.

The diaphragm 30 forms a deformable vibration region 31 (see FIG. 3) forming a part of a wall of the pressure chamber 21. The head 1 includes the piezoelectric elements 40 on a surface of the diaphragm 30 opposite to a surface that faces the pressure chamber 21 in the vibration region 31. The piezoelectric elements 40 and the vibration region 31 of the diaphragm 30 form a single unit (see FIG. 3).

Each of the piezoelectric elements 40 includes a lower electrode 41, a piezoelectric layer 42 (piezoelectric body), and an upper electrode 43 laminated in the above-described order from the vibration region 31. The head 1 includes an insulation film 25 on the piezoelectric elements 40.

The lower electrode 41 serves as a common electrode of the plurality of piezoelectric elements 40 is connected to a common-electrode power-supply wiring pattern. The lower electrode 41 is one electrode layer formed across all the piezoelectric elements 40 in the nozzle array direction NAD.

Each of the upper electrodes 43 is connected to a drive integrated circuit (drive IC 500) as a drive circuit via an individual wire 46 and an electrode pad 47 (see FIG. 4). The upper electrodes 43 respectively serve as individual electrodes of the piezoelectric elements 40. The individual wire 46 is covered with an insulation film 26.

The holding substrate 50 covering the piezoelectric elements 40 of the actuator substrate 2 is bonded with an adhesive 114 to the surface of the diaphragm 30 of the actuator substrate 2 on which the piezoelectric elements 40 are formed (see FIG. 3).

As illustrated in FIG. 4, the holding substrate 50 includes the opening 51, a recess 52, and an opening 53. The opening 51 is a part of a channel that connects a common channel and the pressure chamber 21. The recess 52 accommodates the piezoelectric element 40. The opening 53 accommodates the drive IC 500. The opening 51 is a slit-shaped through hole extending in the nozzle array direction NAD. Here, the opening 51 configure a part of a common chamber.

In the holding substrate 50, bonding surfaces 59 such as legs 50a are bonded to a bonding surface 29 of the actuator substrate 2 with the adhesive 114. The leg 50a is formed at each ends of the recess 52 in the nozzle array direction NAD in FIG. 4. The recess 52 accommodates the piezoelectric element 40.

In the head 1, voltage is applied from the drive IC 500 to a portion between the upper electrode 43 and the lower electrode 41 of the piezoelectric element 40. The piezoelectric layer 42 expands in an electrode lamination direction, that is, an electric field direction (height direction in FIG. 3), and contracts in a direction parallel to the vibration region 31 (horizontal direction in FIG. 3). Thus, tensile stress arises at the lower electrode 41 side of the vibration region 31, causing the vibration region 31 to bend toward the pressure chamber 21. As a result, the liquid in the pressure chamber 21 is pressurized, and the liquid is discharged from the nozzle 11.

Figure 5:
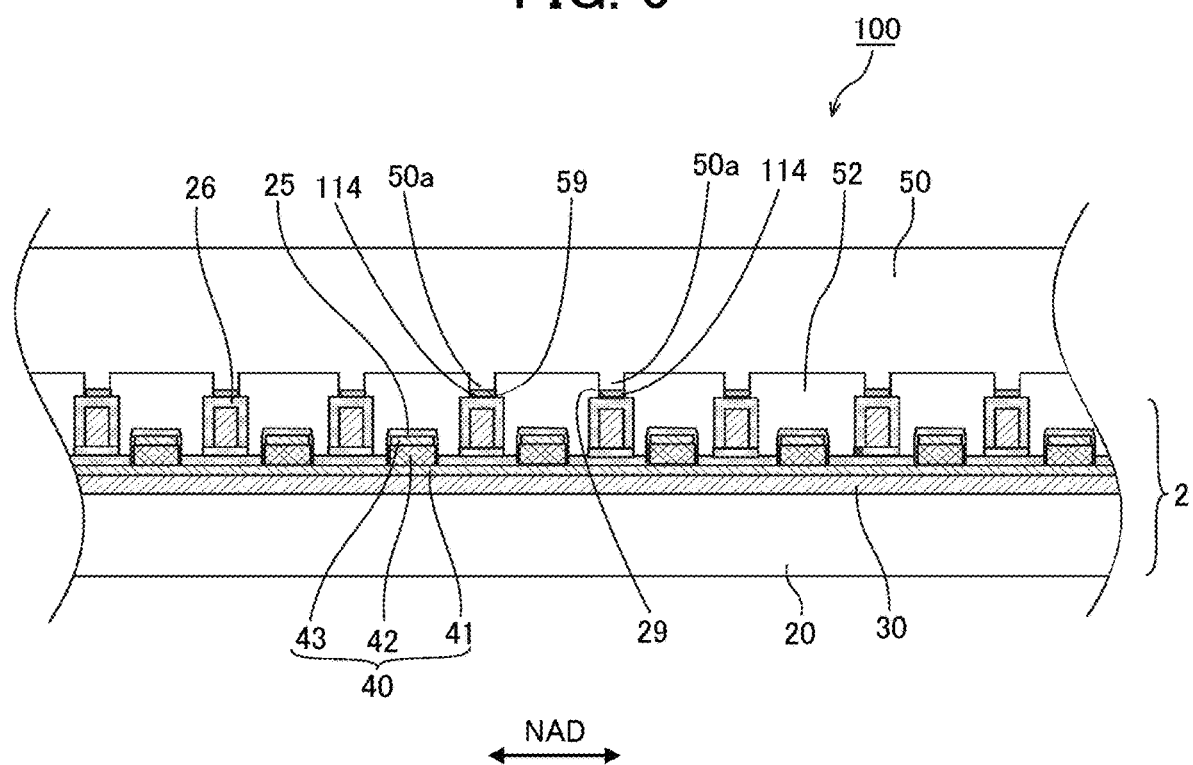
FIG. 5 is a cross-sectional view of a bonded member in the first embodiment.
Figure 6:
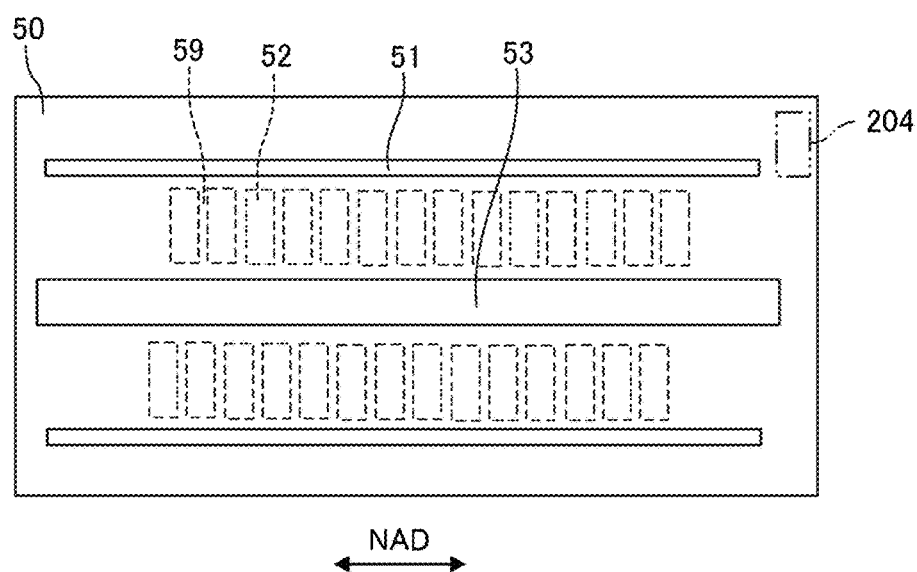
FIG. 6 is a schematic plan view of a holding substrate.
Figure 7:
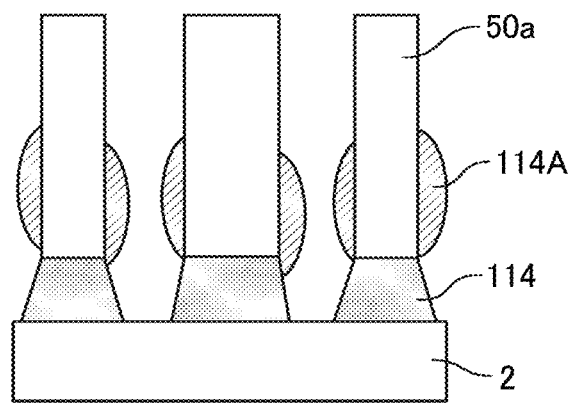
FIG. 7 is a schematic cross-sectional view of legs of the holding substrate illustrating an adhesive protruding from the legs of the holding substrate.

Next, a method to check a bonding and a bonding state between the actuator substrate 2 configuring the bonding member 100 according to the first embodiment and the holding substrate 50 is described with reference to FIGS. 5 to 7. FIG. 5 is a schematic cross-sectional view of the bonding member 100. FIG. 6 is a schematic plan view of the holding substrate 50. FIG. 7 is a schematic cross-sectional view of the legs 50a of the holding substrate 50 illustrating an adhesive 114A spilled out of the legs 50a of the holding substrate 50.

A bonding member 100 is a member in which the holding substrate 50 is bonded to the actuator substrate 2. In the following description, the actuator substrate 2 is referred to as a first member, and the holding substrate 50 is referred to as a second member.

The bonding member 100 includes a bonding surface 59 of the holding substrate 50 bonded to the bonding surface 29 of the actuator substrate 2 with the adhesive 114. The bonding surface 59 of the holding substrate 50 is formed on each of a lower (leading) end of the legs 50a between the recesses 52 of the holding substrate 50 and a wall portion 50b (see FIG. 4) on the openings 51 and 53. In the above-described configuration, it is important to appropriately control an amount of the adhesive 114.

Therefore, it is necessary to check the bonding state of the adhesive 114 regarding the adhesive 114 that adheres between the bonding surface 59 of the holding substrate 50 and the bonding surface 29 of the actuator substrate 2, whether there is excessive protrusion of the adhesive 114, and whether there is a shortage of the adhesive 114. It is required to confirm the bonding state such as whether or not.

The bonding state can be determined by, for example, observing a fillet shape of the adhesive 114. However, it is difficult to visually confirm the bonding state of a bonding portion between the bonding surface 59 of the legs 50a of the holding substrate 50 and the bonding surface 29 of the actuator substrate 2 due to an existence of the holding substrate 50. The legs 50a of the holding substrate 50 are positioned between the piezoelectric elements 40.

There is a method of observing the bonding portion through the holding substrate 50 using an infrared microscope (IR microscope), for example, to visually confirm the bonding state at the bonding portion not visually recognized from the outside of the holding substrate 50. However, it is difficult to confirm the fillet shape of the adhesive 114 since an image observed by the IR microscope is unclear.

For example, as illustrated in FIG. 7, when the adhesive 114 moves along a side wall surface of the leg 50a, it is difficult to observe and confirm the fillet shape of the adhesive 114 through the holding substrate 50 by the IR microscope because of an excess adhesive 114A that has moved along the side wall surface of the leg 50a.

As described above, it is difficult to determine the bonding state by confirming the fillet shape of the adhesive 114 between the bonding surface 59 of the legs 50a and the bonding surface 29 of the actuator substrate 2 through the holding substrate 50 using the IR microscope.

Figure 8:
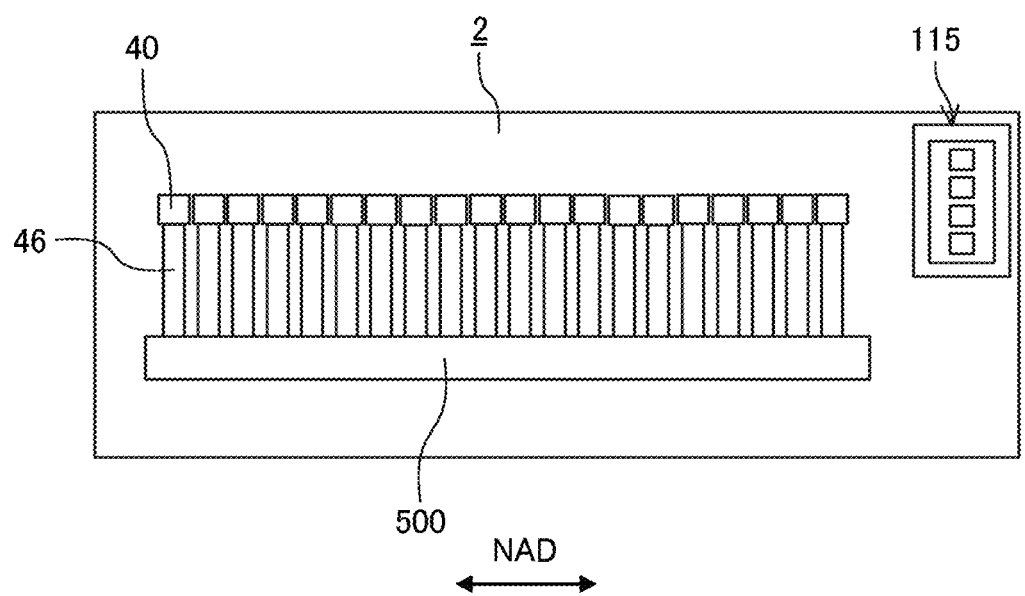
FIG. 8 is a schematic plan view of an actuator substrate.
Figure 9:
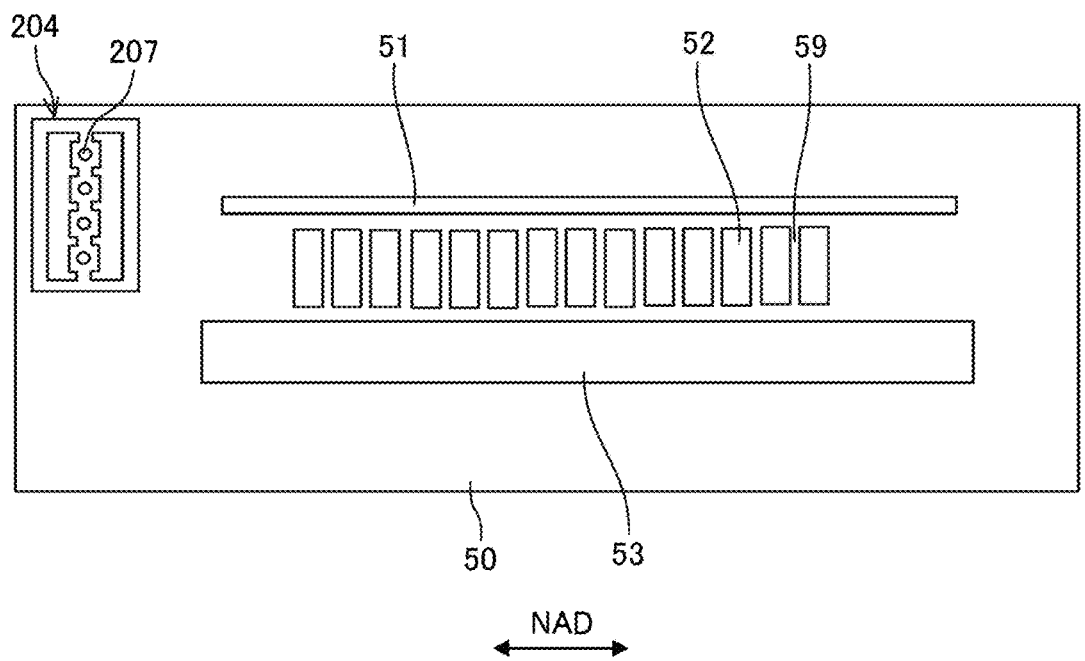
FIG. 9 is a schematic plan view of the holding substrate viewed from a bonded surface side of the holding substrate.
Figure 10:
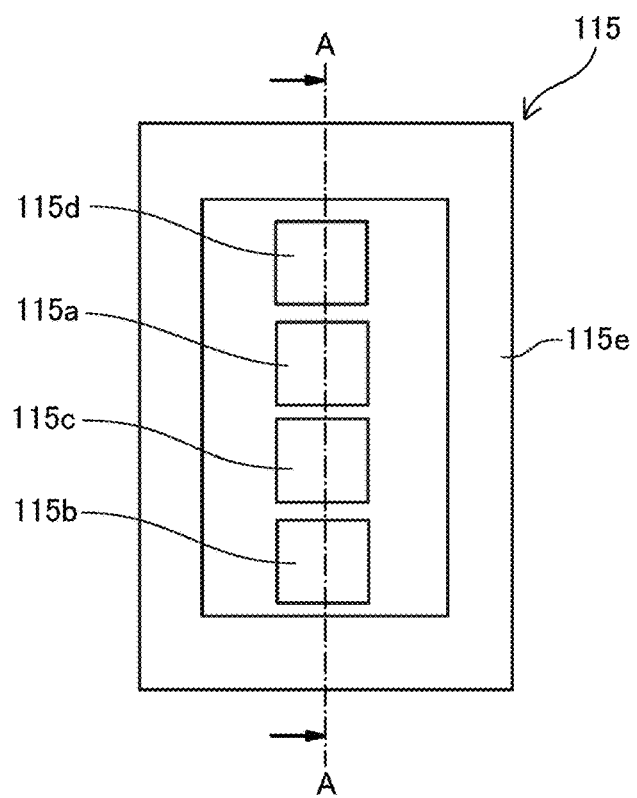
FIG. 10 is a schematic plan view of a surface structure of the actuator substrate.
Figure 11:
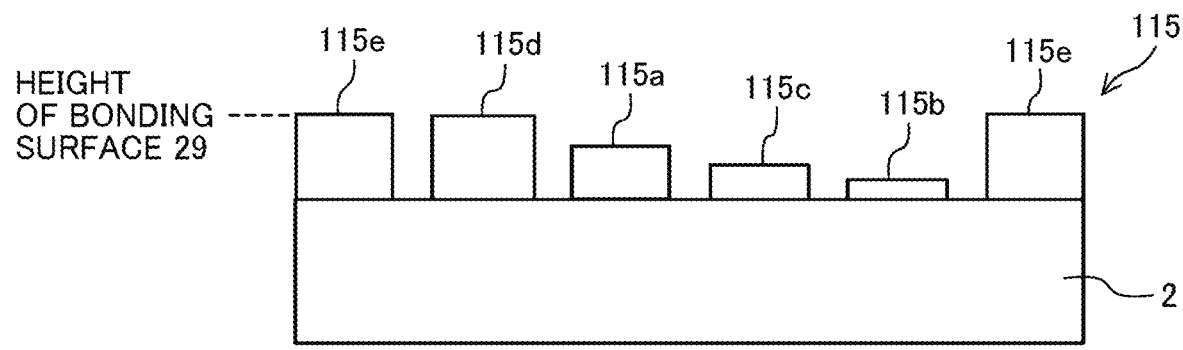
FIG. 11 is a schematic cross-sectional view of the surface structure along a line A-A of FIG. 10.
Figure 12:
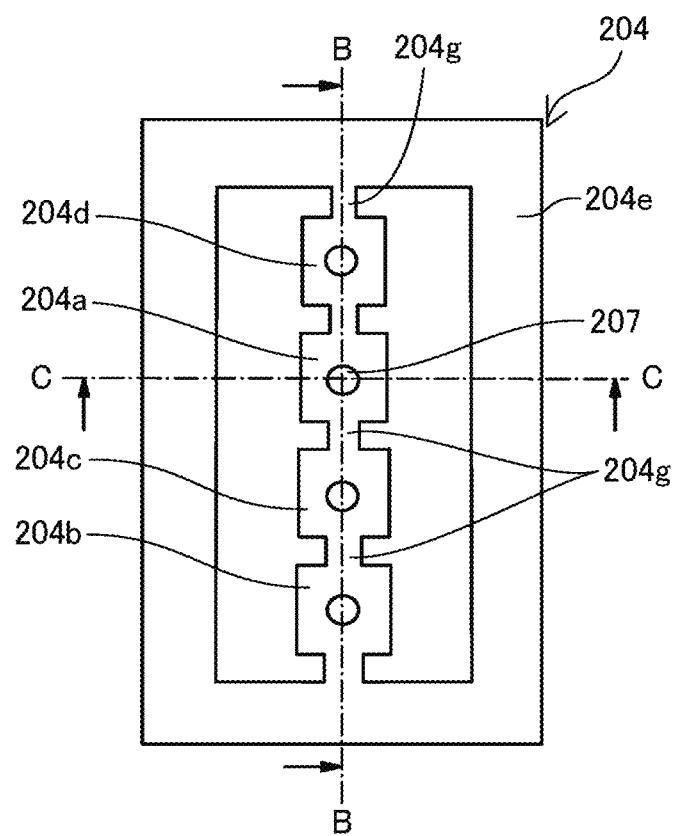
FIG. 12 is a schematic plan view of an opposing surface structure of the holding substrate.
Figure 13:
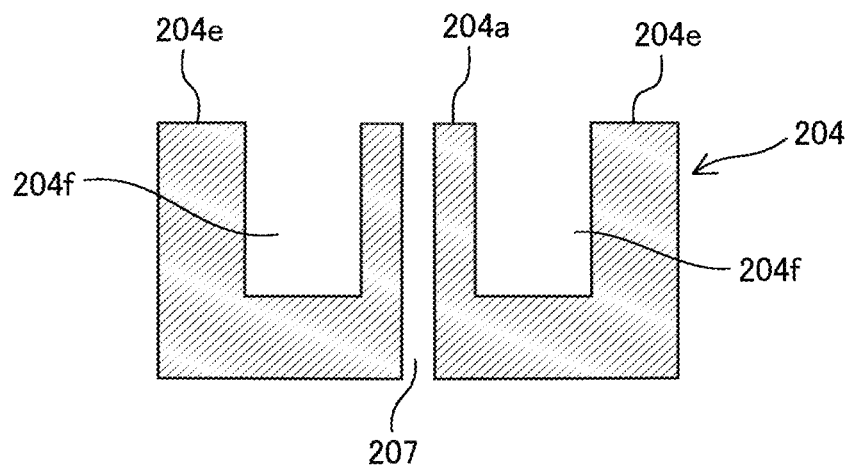
FIG. 13 is a schematic cross-sectional view of the opposing surface structure of the holding substrate along a line C-C of FIG. 12.
Figure 14:
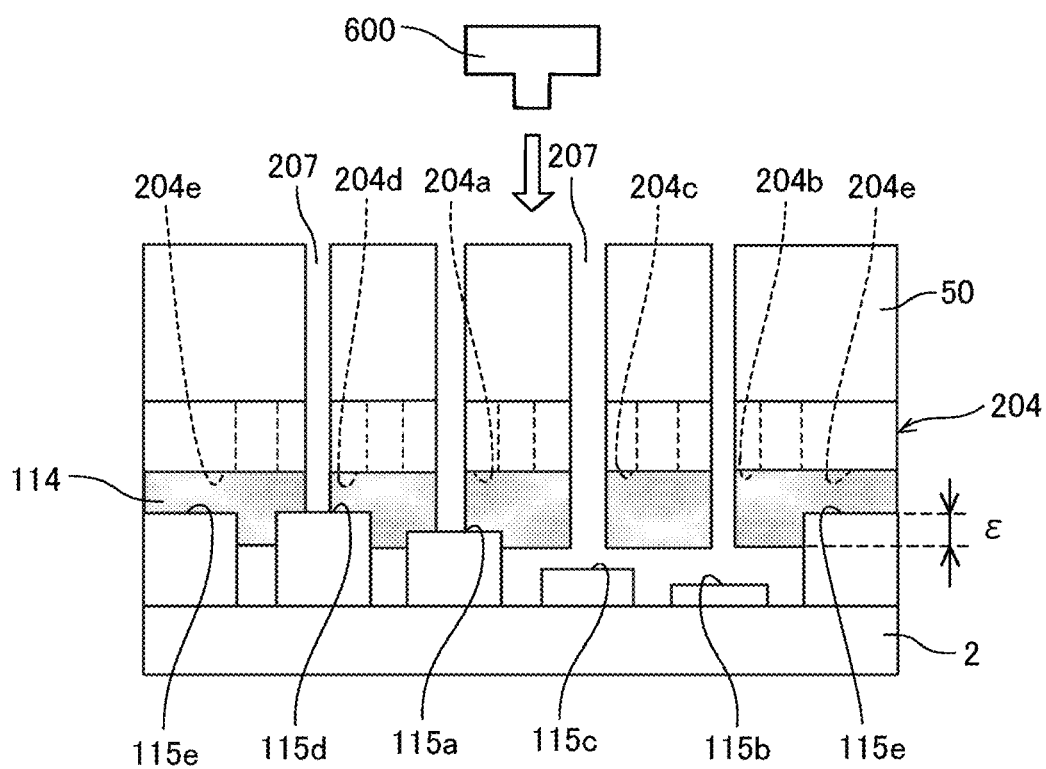
FIG. 14 is a schematic cross-sectional view of the bonding member corresponding to a line A-A of FIG. 10 and a line B-B of FIG. 12.

Next, a configuration relating to a monitoring of the bonding state of the bonding member 100 according to the first embodiment is described with reference to FIGS. 8 to 13. FIG. 8 is a schematic plan view of the actuator substrate 2. FIG. 9 is a schematic plan view of the holding substrate 50 viewed from the bonding surface 59 of the holding substrate 50. FIG. 10 is a schematic plan view of a surface structure 115 of the actuator substrate 2. FIG. 11 is a schematic cross-sectional view of the actuator substrate 2 along a line A-A of FIG. 10. FIG. 12 is a schematic plan view of an opposing surface structure 204 of the holding substrate 50. FIG. 13 is a schematic cross-sectional view of the opposing surface structure 204 of the holding substrate 50 along a line C-C of FIG. 12. FIG. 14 is a schematic cross-sectional view of the holding member 100 corresponding to the line A-A of FIG. 10 and a line B-B of FIG. 12.

As described above, the bonding member 100 includes the actuator substrate 2 as the first member and the holding substrate 50 as the second member. The actuator substrate 2 and the holding substrate 50 are manufactured by chamfering a plurality of silicon wafers, applying an adhesive 114 at a wafer stage to bond the actuator substrate 2 and the holding substrate 50, and dividing the bonded actuator substrate 2 and the holding substrate 50.

However, a method of manufacturing the actuator substrate 2 and the holding substrate 50 are not limited to the method as described above. Therefore, an embodiment of a unit of the actuator substrate 2 and the holding substrate 50 is described below. When a subject is related to manufacturing many bonding members 100 (the actuator substrate 2 and the holding substrate 50) from a wafer, details of which is described below.

The actuator substrate 2 as the first member includes the surface structure 115 on the bonding surface 29 to be bonded to the bonding surface 59 of the holding substrate 50 with the adhesive 114. Conversely, the holding substrate 50 as the second member includes the opposing surface structure 204 corresponding to the surface structure 115 of the actuator substrate 2. The opposing surface structure 204 includes through holes 207 that penetrate the opposing surface structure 204.

The surface structure 115 is also referred to as a "surface portion 115", and the opposing surface structure 204 is also referred to as a "opposing surface portion 204."

The surface structure 115 of the actuator substrate 2 includes a first surface 115a, a second surface 115b, a third surface 115c, a fourth surface 115d, and an enclosure 115e. Positions of the first surface 115a to the fourth surface 115d of the actuator substrate 2 are different in a height direction (bonding direction) toward the bonding surface 59 of the holding substrate 50 opposed to the bonding surface 29 of the actuator substrate 2. Hereinafter, the height direction is also referred to as the "bonding direction" that is a direction in which the holding substrate 50 (second member) is bonded to the actuator substrate 2 (first member).

The first surface 115a to the fourth surface 115d are arrayed in one line in a direction perpendicular to the nozzle array direction NAD as illustrated in FIGS. 2, 8, and 10.

The first surface 115a is lower than the bonding surface 29 of the actuator substrate 2 to be bonded to the bonding surface 59 of the holding substrate 50. The second surface 115b is lower than the first surface 115a. The third surface 115c is lower than the first surface 115a and higher than the second surface 115b.

The fourth surface 115d has the same height as the bonding surface 29 of the actuator substrate 2 to be bonded to the leg 50a of the holding substrate 50. The enclosure 115e also has the same height as the bonding surface 29 of the actuator substrate 2.

For example, a height of the fourth surface 115d and the enclosure 115e is 4 µm (same as the height of the bonding surface 29), the height of the first surface 115a is 3 µm, the height of the second surface 115b is 1 µm, and the height of the third surface 115c is 2 µm.

An order of arrangement of the first surface 115a to the fourth surface 115d in the present embodiment is not limited to the embodiments as described above. Further, the first surface 115a to the fourth surface 115d are formed on surfaces of top ends (upper ends in FIG. 11) of independent convex portions. If the heights of the first surface 115a to the fourth surface 115d are different, one convex portion may form the first surface 115a to the fourth surface 115d in a single unit.

The enclosure 115e is a bonding surface to be bonded to the enclosure 204e of the opposing surface structure 204 of the holding substrate 50 with the adhesive 114. The height of the enclosure 115e is the same as the height of the fourth surface 115d, and the enclosure 115e performs the same function as the fourth surface 115d.

As illustrated in FIG. 12, the opposing surface structure 204 of the holding substrate 50 includes a first wide portion 204a to a fourth wide portion 204d, the height of each of surface (plane) of which is the same. The first wide portion 204a to the fourth wide portion 204d are respectively opposed to the first surface 115a to the fourth surface 115d on the surface structure 115 of the actuator substrate 2 to be bonded to the opposing surface structure 204 of the holding substrate 50 with the adhesive 114. The first wide portion 204a to the fourth wide portion 204d have the same height as the bonding surface 59.

The first wide portion 204a to the fourth wide portion 204d are arrayed in one line in the direction perpendicular to the nozzle array direction NAD as illustrated in FIGS. 6, 9, and 12.

At least a part of the periphery of the first wide portion 204a to the fourth wide portion 204d includes a recess 204f (see FIG. 13) that forms a portion having a height lower than the heights of the first wide portion 204a to the fourth wide portion 204d.

The opposing surface structure 204 includes the recess 204f lower than the first wide portion 204a and the second wide portion 204b in a periphery of the first wide portion 204a and the second wide portion 204b.

Further, the opposing surface structure 204 in the first embodiment includes bridge portions 204g between each of the first wide portion 204a to the fourth wide portion 204d, between the first wide portion 204a and the enclosure 204e, and between the second wide portion 204b and the enclosure 204e.

The bridge portions 204g are also referred to as narrow portions, the width of which are narrower than widths of the first wide portion 204a to the fourth wide portion 204d. The bridge portions 204g connects the enclosure 204e and the fourth wide portion 204d, the fourth wide portion 204d and the first wide portion 204a, the first wide portion 204a and the third wide portion 204c, the third wide portion 204c and the second wide portion 204b, and the second wide portion 204b and the enclosure 204e as illustrated in FIG. 12.

Thus, each of the first wide portion 204a to the fourth wide portion 204d is wider than the bridge portion 204g.

Further, the holding substrate 50 includes a through hole 207 having openings in each of the first wide portion 204a to the fourth wide portion 204d that respectively face the first surface 115a to the fourth surface 115d of the surface structure 115 of the actuator substrate 2. The through hole 207 penetrates the holding substrate 50 including the opposing surface structure 204 in a thickness direction of the holding substrate 50.

Thus, each of the first wide portion 204a to the fourth wide portion 204d includes a through hole 207 in a center of each of the first wide portion 204a to the fourth wide portion 204d.

In the first embodiment, the adhesive 114 to bond the actuator substrate 2 and the holding substrate 50 is applied to the holding substrate 50 by a thin-film transfer using a flexographic printing, for example.

The opposing surface structure 204 according to the first embodiment includes the first wide portion 204a to the fourth wide portion 204d, the bridge portion 204g, and the enclosure 204e other than the recess 204f each having the same height. The adhesive 114 is applied to the first wide portion 204a to the fourth wide portion 204d, the bridge portion 204g, and the enclosure 204e other than the recess 204f Conversely, the adhesive 114 is not applied to the recesses 204f and the through holes 207.

The opposing surface structure 204 according to the first embodiment includes the bridge portion 204g to reinforce the first wide portion 204a to the fourth wide portion 204d. The bridge portion 204g improve a strength compared to a structure in which the first wide portion 204a to the fourth wide portion 204d are independently formed. Thus, the bridge portion 204g can prevent breakage of the first wide portion 204a to the fourth wide portion 204d when the adhesive 114 is thin-film transferred to the first wide portion 204a to the fourth wide portion 204d by flexographic printing on a wafer basis.

Further, the recesses 204f formed in a periphery of the first wide portion 204a to the fourth wide portion 204d in the first embodiment allow an excessive adhesive 114 applied to the opposing surface structure 204 of the holding substrate 50 to escape to the recesses 204f when the actuator substrate 2 and the holding substrate 50 are bonded to each other.

An entire area of the opposing surface structure 204 of the holding substrate 50 may be formed as a uniform flat (planar) surface without such recesses 204f Then, the excessive adhesive 114 may move in a planar direction to a surface portion that should not come into contact among the four surfaces (first surface 115a to fourth surface 115d) of the surface structure 115 of the actuator substrate 2. Here, the planer direction is along a uniform flat (planar) surface of the opposing surface structure 204. Thus, it may be difficult to accurately evaluate the bonding state between the actuator substrate 2 and the holding substrate 50.

The recesses 204f in the first embodiment can prevent an occurrence of such a situation and thus enabling a further accurate evaluation of the bonding state.

Next, an evaluation of the bonding state between the actuator substrate 2 and the holding substrate 50 is described below.

The actuator substrate 2 is bonded to the holding substrate 50 with the adhesive 114. Further, the infrared microscope 600 (IR microscope) or the like is used to observe and confirm whether the adhesive 114 is applied to the first surface 115a to the fourth surface 115d of the actuator substrate 2 from the holding substrate 50 side.

That is, it is confirmed by which of the first surface 115a to the fourth surface 115d is bonded (contacted) with the opposing surface structure 204 of the holding substrate 50 with the adhesive 114. Thus, it is possible to evaluate whether the bonding state is appropriate or not, for example, the bonding state in which the adhesive 114 is in a shortage state, an excessive state, or an appropriate state.

The holding substrate 50 having a light-transmitting property to transmit infrared light like a silicon substrate can enable an observation of the bonding state between the actuator substrate 2 and the holding substrate 50 by the infrared light transmitted through the holding substrate 50.

In an example illustrated in FIG. 14, the fourth surface 115d having the same height as the bonding surface 29 of the actuator substrate 2 is bonded to the fourth wide portion 204d and the enclosure 204e having the same height as the bonding surface 59 of the opposing surface structure 204 with the adhesive 114. The enclosure 115e having the same height as the bonding surface 29 of the actuator substrate 2 is bonded to the enclosure 204e having the same height as the bonding surface 59 of the opposing surface structure 204 with the adhesive 114. Further, the first surface 115a that is lower than the fourth surface 115d and the enclosure 115e is bonded to the first wide portion 204a and the fourth wide portion 204d with the adhesive 114.

Conversely, the third surface 115c that is lower than the first surface 115a is not bonded to the third wide portion 204c and the first wide portion 204a with the adhesive 114. The second surface 115b that is lower than the third surface 115c is not bonded to the second wide portion 204b and the third wide portion 204c with the adhesive 114. Thus, it can be confirmed that at least a predetermined pushing amount c (for example, 1 µm) is obtained.

The pushing amount c means that a pushing amount (pushed height) of the adhesive 114 attached to the enclosure 204e of the opposing surface structure 204 of the holding substrate 50 by the enclosure 115e of the surface structure 115 of the actuator substrate 2 when the actuator substrate 2 and the holding substrate 50 are bonded.

The height of the enclosure 115e of the surface structure 115 of the actuator substrate 2 is the same as the height of the bonding surface 29 of the actuator substrate 2. The height of the enclosure 204e of the opposing surface structure 204 of the holding substrate 50 is the same as the height of the bonding surface 59. Therefore, the pushing amount corresponds to a pushing amount ε of the adhesive 114 at a bonding portion between the bonding surface 29 and the bonding surface 59.

For example, it is evaluated that there is no gap between the bonding surface 29 of the actuator substrate 2 and the bonding surface 59 of the holding substrate 50, and there is no insufficient adhesion between the bonding surface 29 and the bonding surface 59 when a target thickness of the adhesive 114 is 3 μm on average and the pushing amount ε is 1 μm or more.

Then, it is evaluated that the bonding state is not insufficient because at least the predetermined pushing amount ε (for example, 1 μm) is obtained in the example illustrated in FIG. 14 as described above.

That is, the bonding member 100 is not in a state of insufficient bonding at least when the first surface 115a of the actuator substrate 2 is bonded to the holding substrate 50 as the second member with the adhesive 114.

The bonding member 100 in the first embodiment includes the first wide portion 204a to the fourth wide portion 204d of the opposing surface structure 204 of the holding substrate 50 as the second member including the through holes 207 that respectively opens toward the first surface 115a to the fourth surface 115d of the actuator substrate 2 as the first member.

Thus, when the actuator substrate 2 is bonded to the holding substrate 50, voids (air bubbles) in the adhesive 114 escape from the through holes 207, so that a clear image can be obtained when the bonding member 100 is observed with the IR microscope 600. As a result, the bonding member 100 can improve reliability of confirmation of the bonding state.

Figure 18:
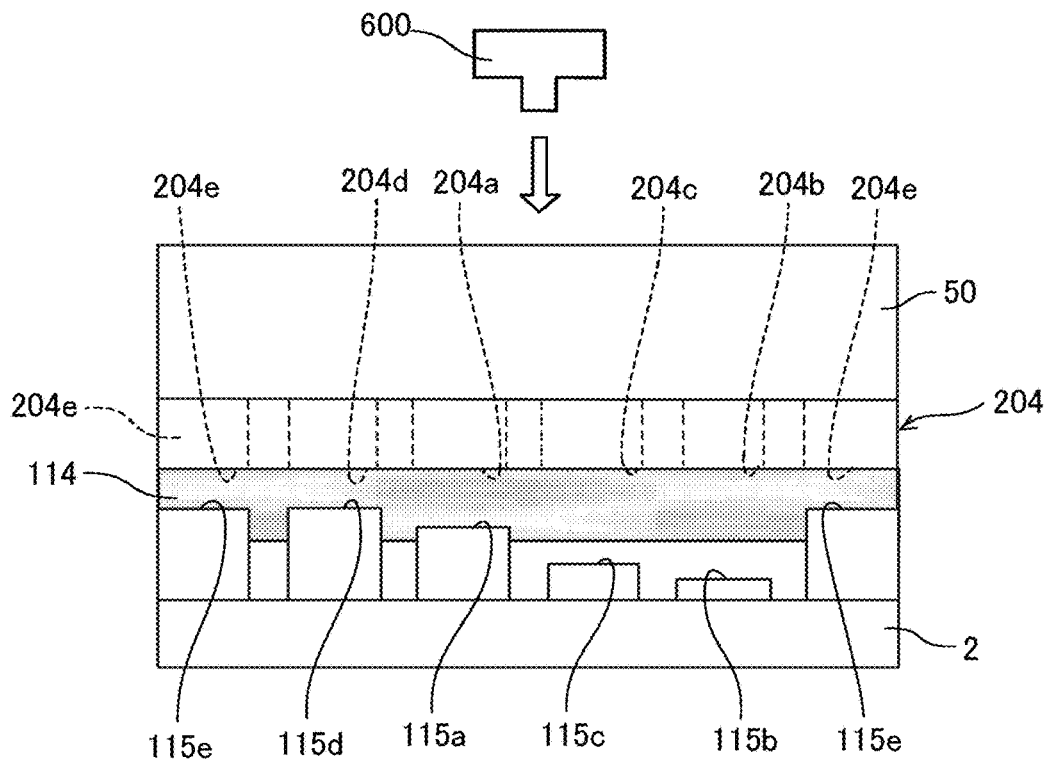
FIG. 18 is a schematic cross-sectional view of a comparative example of the bonding state of the bonding member.

That is, the voids in the adhesive 114 cannot come out of the adhesive 114 in a structure that does not include a through hole 207 as in Comparative Example 1 illustrated in FIG. 18. Thus, a clear image cannot be obtained when the bonding member 100 is observed with the IR microscope 600.

Further, the voids in the adhesive 114 can escape through the opening 39 around the opening 39 of the diaphragm 30 that actually needs to be sealed. Thus, a clear image can be obtained without voids when the bonding state is confirmed by the IR microscope 600. Thus, a structure of the portion that actually needs to be sealed is made identical to a structure of a bonding monitor including the surface structure 115 and the opposing surface structure 204 as described above. Thus, a clearer image can be obtained, and inspection reliability can be improved.

The adhesive 114 may have a waved shape after the adhesive 114 is applied to the holding substrate 50 depending on types of the adhesive 114. For example, even if a thickness of the adhesive 114 is 3 μm on average, an actual thickness may fluctuate within a range of 2.5 μm or more and 3.5 μm or less. Even in the above-described case, if a pushing amount of 1.0 μm or more is secured, a pushing amount of 0.5 μm or more is secured even at a position at which a thickness of the adhesive 114 is the minimum value of 2.5 μm.

Thus, it is possible to avoid the bonding state of insufficient adhesion. Further, even if air bubbles are caught in a waved shape portion in the adhesive 114, the air bubbles are discharged from the through holes 207. Thus, it is possible to determine the bonding state based on a clear image of the bonding state of the bonding portion. The threshold value of the pushing amount c is set according to a type of adhesive, a method of applying the adhesive 114, and the like.

Figure 15:
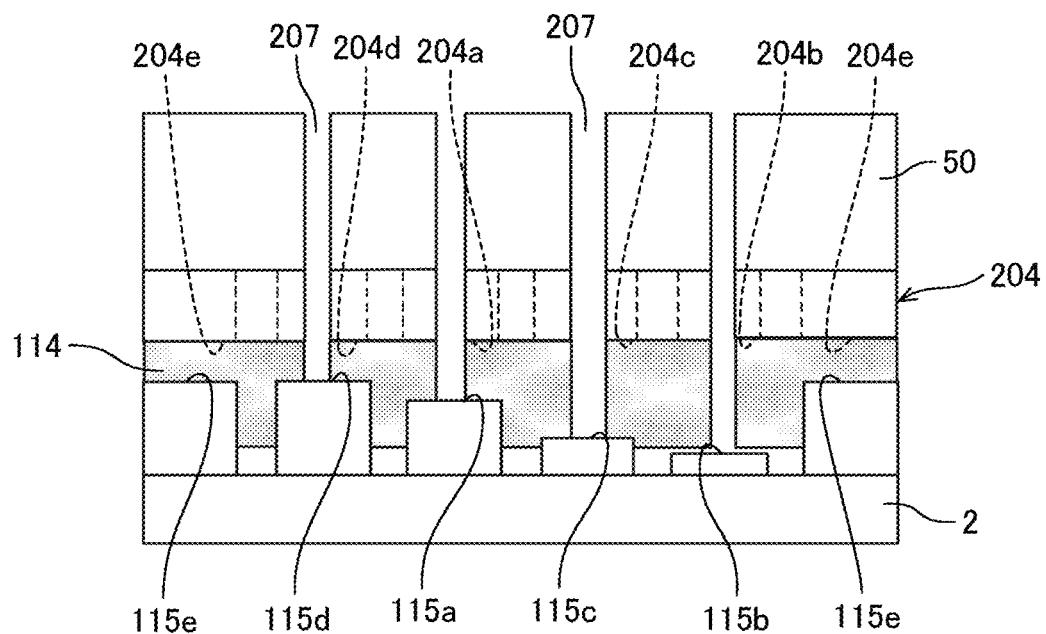
FIG. 15 is a schematic cross-sectional view of another example of a bonding state of the bonding member.
Figure 16:
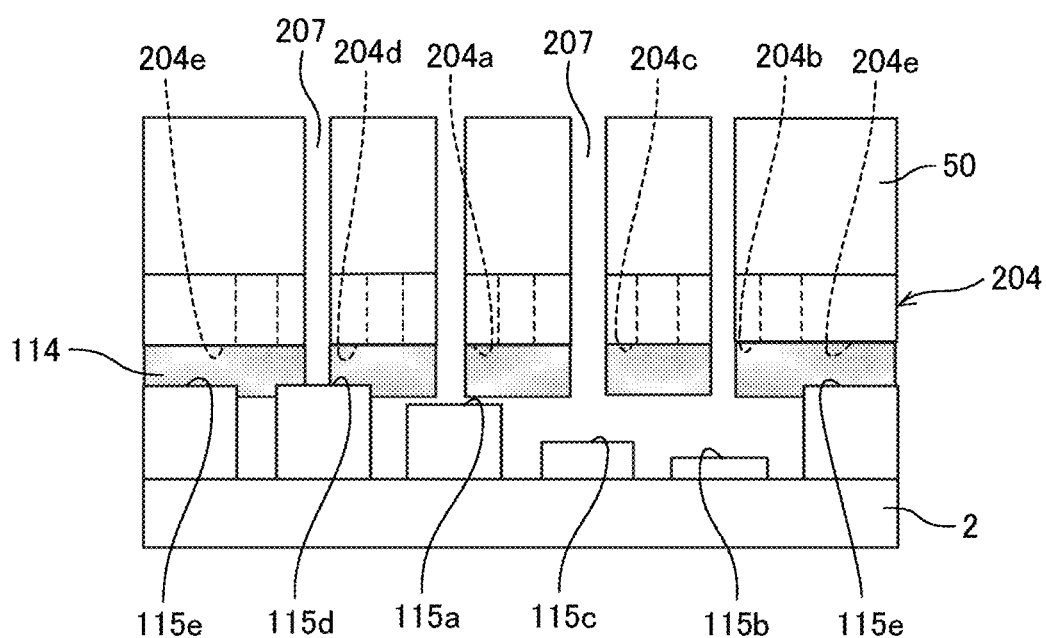
FIG. 16 is a schematic cross-sectional view of still another example of the bonding state of the bonding member.
Figure 17:
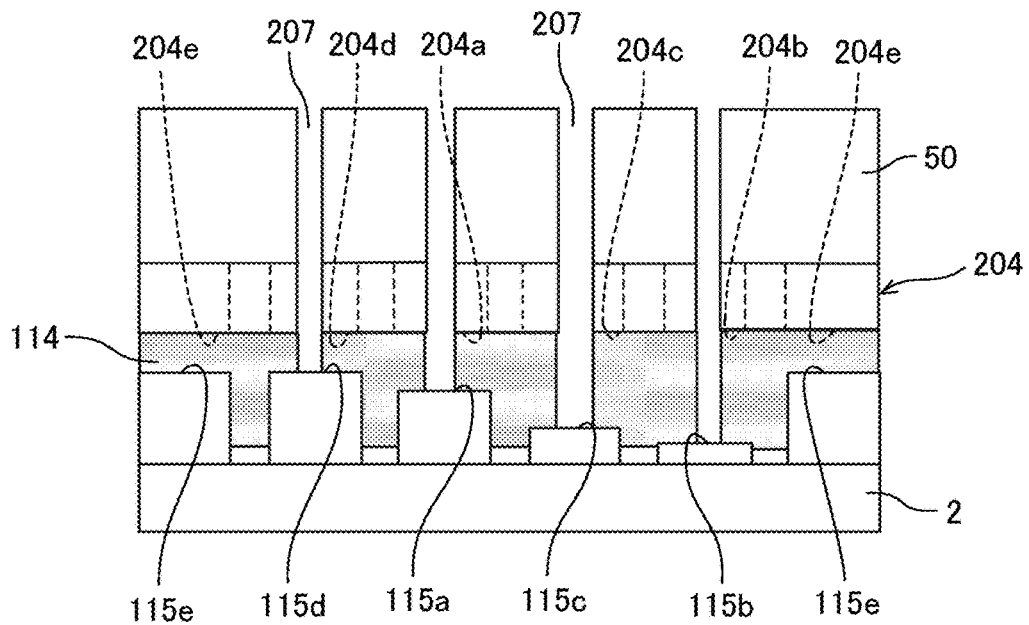
FIG. 17 is a schematic cross-sectional view of still another example of the bonding state of the bonding member.

Next, another example of the bonding state of the bonding members 100 is described with reference to FIGS. 15 to 17. FIGS. 15 to 17 are schematic cross-sectional views similar to FIG. 14 to illustrate an evaluation of the bonding state between the actuator substrate 2 and the holding substrate 50.

In the bonding state illustrated in FIG. 15, the fourth surface 115d having the same height as the bonding surface 29 of the actuator substrate 2 is bonded to the enclosure 204e and the fourth wide portion 204d having the same height as the bonding surface 59 of the opposing surface structure 204 with the adhesive 114 among the surface structure 115 of the actuator substrate 2.

Further, the enclosure 115e having the same height as the bonding surface 29 of the actuator substrate 2 is bonded to the enclosure 204e having the same height as the bonding surface 59 of the opposing surface structure 204 with the adhesive 114 among the surface structure 115 of the actuator substrate 2.

Further, the first surface 115a that is lower than the fourth surface 115d is bonded to the first wide portion 204a and the fourth wide portion 204d with the adhesive 114. The third surface 115c that is lower than the first surface 115a is bonded to the third wide portion 204c and the first wide portion 204a with the adhesive 114. However, the second surface 115b that is lower than the third surface 115c is not bonded to the second wide portion 204b and the third wide portion 204c with the adhesive 114.

Such a bonding state illustrated in FIG. 15 can be evaluated as a good bonding state.

Conversely, in the bonding state as illustrated in FIG. 16, the fourth surface 115d having the same height as the bonding surface 29 of the actuator substrate 2 is bonded to the fourth wide portion 204d and the enclosure 204e having the same height as the bonding surface 59 of the opposing surface structure 204 with the adhesive 114 among the surface structure 115 of the actuator substrate 2. Further, the enclosure 115e having the same height as the bonding surface 29 of the actuator substrate 2 is bonded to the enclosure 204e having the same height as the bonding surface 59 of the opposing surface structure 204 with the adhesive 114 among the surface structure 115 of the actuator substrate 2.

However, none of the first surface 115a to the third surface 115c, that are lower than the fourth surface 115d and the enclosure 115e, is bonded to the first wide portion 204a to the third wide portion 204c with the adhesive 114.

Thus, such a bonding state illustrated in FIG. 16 can be evaluated as a poor bonding state because of an insufficient adhesive 114.

In the bonding state as illustrated in FIG. 17, all of the first surface 115a to the fourth surface 115d and the enclosure 115e of the surface structure 115 of the actuator substrate 2 are bonded to the first wide portion 204a to the fourth wide portion 204d and the enclosure 204e with the adhesive 114.

Thus, such a bonding state can be evaluated as poor bonding state because of an excessive adhesive 114.

Figure 19:
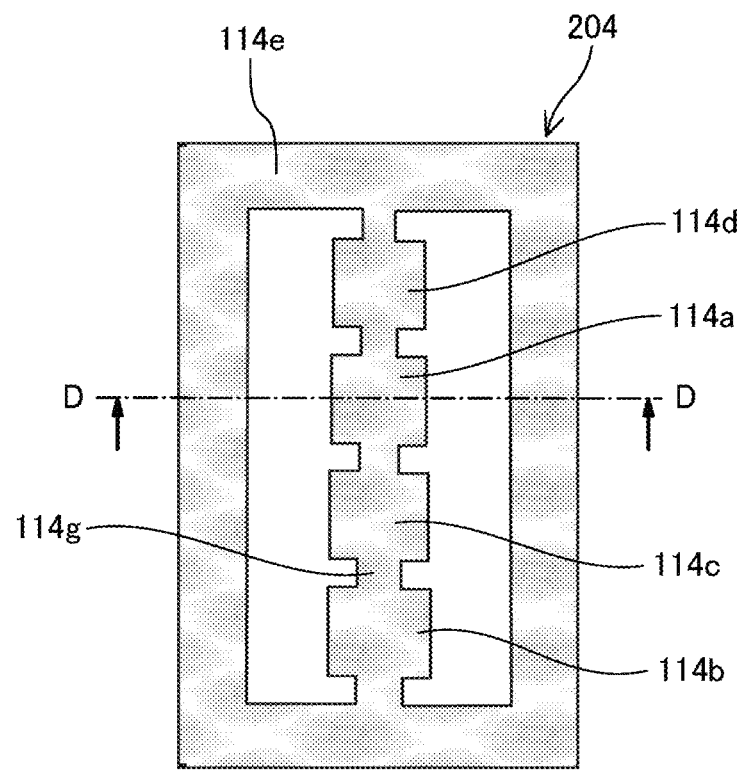
FIG. 19 is a schematic plan view of the opposing surface structure of the holding substrate according to a second embodiment of the present disclosure in which an adhesive is applied to the opposing surface structure of the holding substrate.
Figure 20:
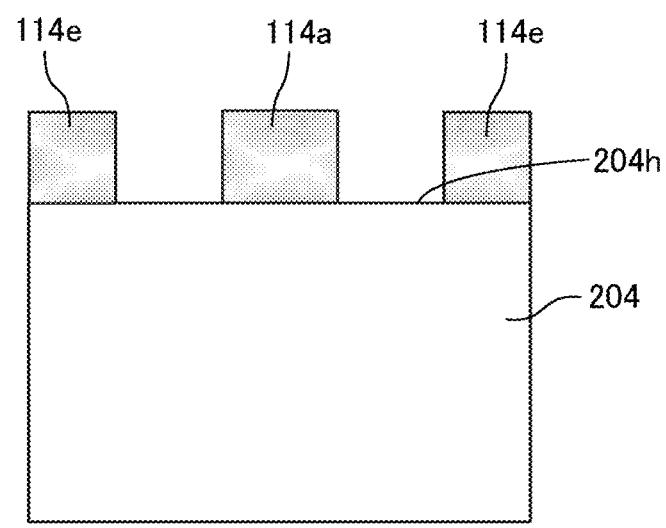
FIG. 20 is a schematic cross-sectional view of the opposing surface structure along a line D-D of FIG. 19.

Next, a bonding member 100 according to a second embodiment of the present disclosure is described with reference to FIGS. 19 and 20. FIG. 19 is a schematic plan view of the opposing surface structure 204 of the holding substrate 50 according to the second embodiment in which an adhesive 114 is applied to the opposing surface structure 204 of the holding substrate 50. FIG. 20 is a schematic cross-sectional view of the opposing surface structure 204 along a line D-D of FIG. 19.

The bonding member 100 in the second embodiment includes the opposing surface structure 204 of the holding substrate 50 includes an opposing surface 204h having the same height as the bonding surface 59.

When the adhesive 114 is applied to the opposing surface 204h of the opposing surface structure 204, a first shape portion 114a to a fourth shape portion 114d, an enclosure 114e, and a bridging shape portion 114g are patterned by the adhesive 114. The first shape portion 114a to a fourth shape portion 114d, an enclosure 114e, and a bridging shape portion 114g have substantially the same shape as the first surface 115a to fourth surface 115d, and the enclosure 115e of the surface structure 115 of the actuator substrate 2.

Thus, the adhesive 114 does not move to a surface that should not contact with the adhesive 114 among four surfaces of the first surface 115a to the fourth surface 115d of the surface structure 115 of the actuator substrate 2 even if the opposing surface structure 204 does not include the recess 204f in FIG. 13 in the first embodiment.

Therefore, unlike an application of the adhesive by flexographic printing, the bonding member 100 in the second embodiment can prevent the adhesive 114 from protruding from the bonding portion to hinder accurate evaluation of the bonding state.

Figure 21:
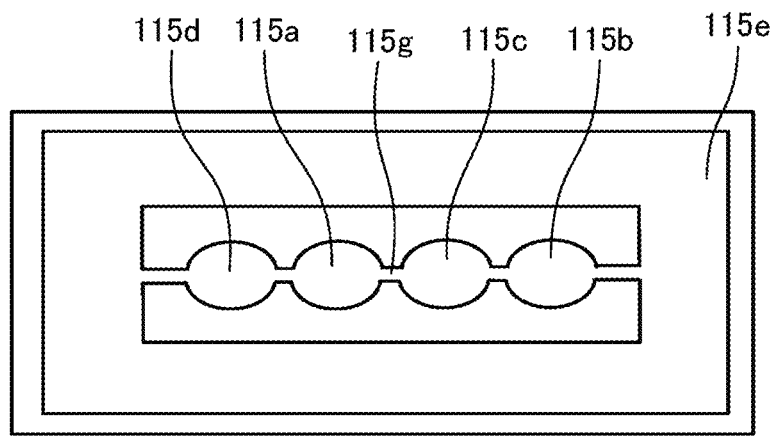
FIG. 21 is a schematic plan view of the surface structure of the actuator substrate according to a third embodiment of the present disclosure.
Figure 22:
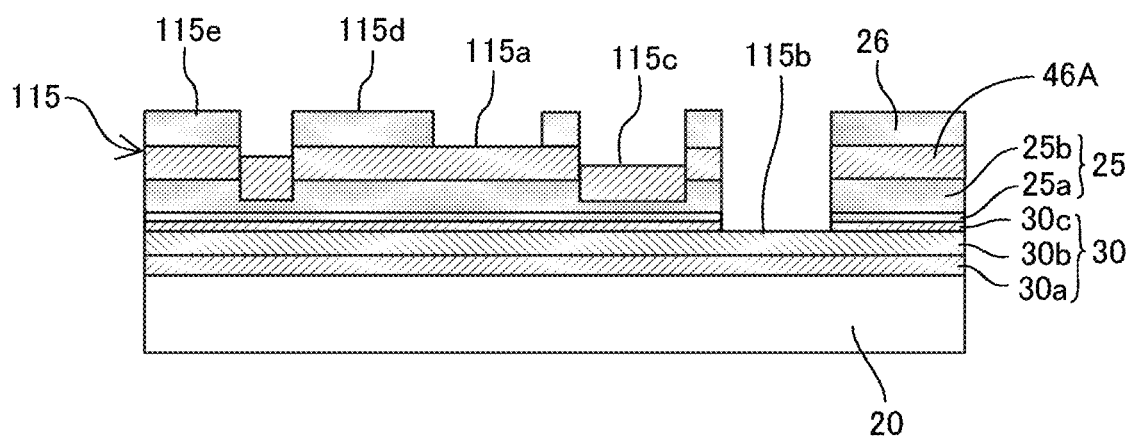
FIG. 22 is a cross-sectional view of the surface structure of the actuator substrate of FIG. 21.

Next, a bonding member 100 according to a third embodiment of the present disclosure is described with reference to FIGS. 21 and 22. FIG. 21 is a schematic plan view of the surface structure 115 of the actuator substrate 2 according to the third embodiment of the present disclosure. FIG. 22 is a schematic cross-sectional view of the surface structure 115 of the actuator substrate 2 of FIG. 21.

In the third embodiment, the surface structure 115 of the actuator substrate 2 is made of the same materials as other components of the actuator substrate 2. Accordingly, the first surface 115a to the fourth surface 115d and the enclosure 115e of the surface structure 115 can be easily formed in a film-forming process to form the piezoelectric element or the like of the actuator substrate 2.

The diaphragm 30 in the third embodiment has a three-layer structure of an $SiO_2$ film 30a, an Si layer 30b, and an $SiO_2$ film 30c from the channel plate 20 side. The insulation film 25 includes a two-layer structure including an $Al_2O_3$ film 25a and a SiN film 25b. A wiring film 46A is a single layer of Al. The insulation film 26 is a single layer of SiN.

Each of the fourth surface 115d and the enclosure 115e has a structure in which the diaphragm 30, the insulation film 25 having a two-layer structure, the wiring film 46A of the individual wire 46, and the insulation film 26 are laminated.

The second surface 115b has a structure in which two layers of the $SiO_2$ film 30a and the Si layer 30b among three layers of the diaphragm 30 are laminated. As described above, the diaphragm 30 has a three-layer structure of the $SiO_2$ film 30a, the Si layer 30b, and the $SiO_2$ film 30c. Thus, the second surface 115b does not include the $SiO_2$ film 30c in the diaphragm 3. The second surface 115b is lower than the fourth surface 115d and the enclosure 115e by layer thicknesses of the $SiO_2$ film 30c of the diaphragm 3, the insulation film 25, the wiring film 46A, and the insulation film 26.

The first surface 115a has a structure in which the diaphragm 30, the insulation film 25, and the wiring film 46A are laminated. The height of the first surface 115a is lower than a height of the fourth surface 115d and the enclosure 115e by the layer thickness of the insulation film 26.

The third surface 115c has a structure in which the diaphragm 30, the insulation film 25, and the wiring film 46A are laminated. The third surface 115c is lower than the fourth surface 115d and the enclosure 115e by the layer thickness of the insulation film 26 and a part of the insulation film 25.

Further, in the surface structure 115 in third embodiment, the first surface 115a to the fourth surface 115d and the enclosure 115e are bridged with each other by the bridge portion 115g.

Figure 23:
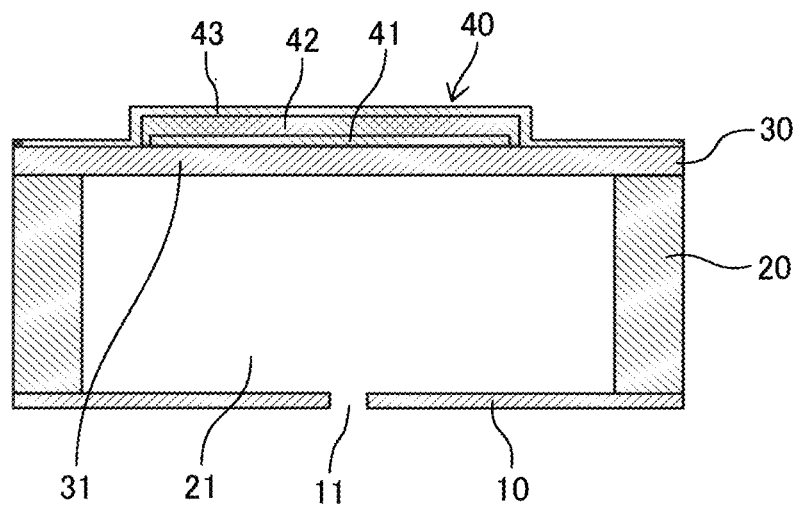
FIG. 23 is a cross-sectional view of a portion of a pressure chamber in the liquid discharge head according to a fourth embodiment of the present disclosure.

Next, the head 1 according to a fourth embodiment of the present disclosure is described with reference to FIG. 23. FIG. 23 is a schematic cross-sectional view of the pressure chamber 21 of the head 1.

The head 1 according to the fourth embodiment includes the lower electrode 41 forming the piezoelectric element 40 as an individual electrode and the upper electrode 43 as a common electrode.

Figure 24:
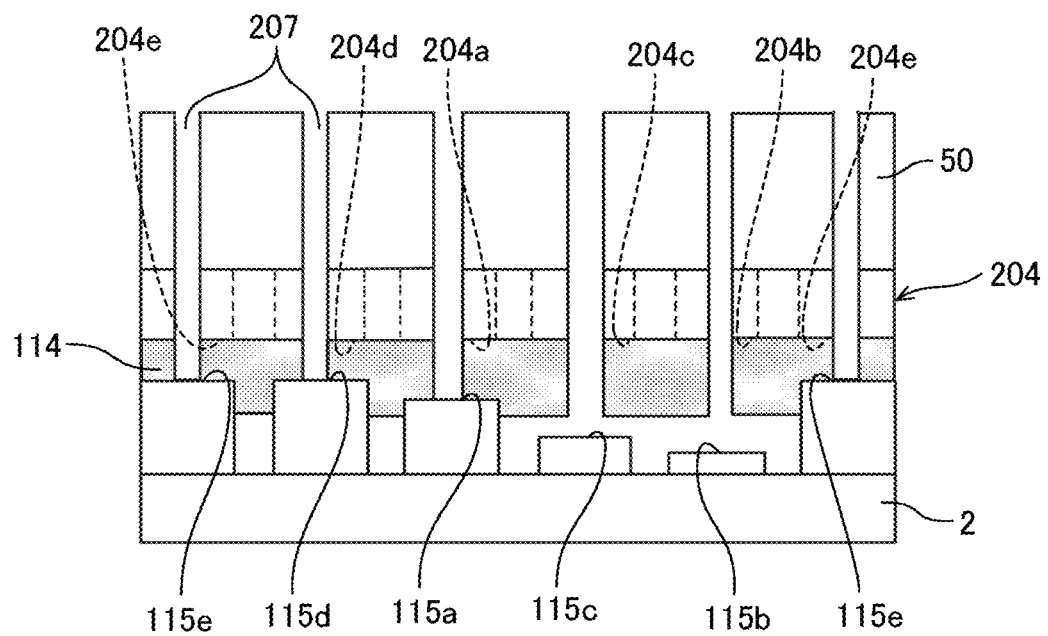
FIG. 24 is a schematic cross-sectional view of the bonding member according to a fifth embodiment of the present disclosure.

Next, a bonding member 100 according to a fifth embodiment of the present disclosure is described with reference to FIG. 24. FIG. 24 is schematic cross-sectional view of the bonding member 100 according to the fifth embodiment of the present disclosure.

The bonding member 100 in the fifth embodiment includes through holes 207 also in the enclosure 204e that configures the opposing surface structure 204 of the holding substrate 50.

Thus, the opposing surface structure 204 of the holding substrate 50 (second member) includes the enclosure 204e that surrounds the first wide portion 204a to the fourth wide portion 204d and the bridge portion 204g. The enclosure 204e includes the through hole 207.

Thus, the void in the adhesive 114 that bonds the enclosure 204e can escape through the through holes 207.

In each of the above-described embodiments, examples are described in which the bonding member 100 of the head 1 includes the actuator substrate 2 bonded to the holding substrate 50. However, the bonding member 100 may be used for a member other than the head 1.

Figure 25:
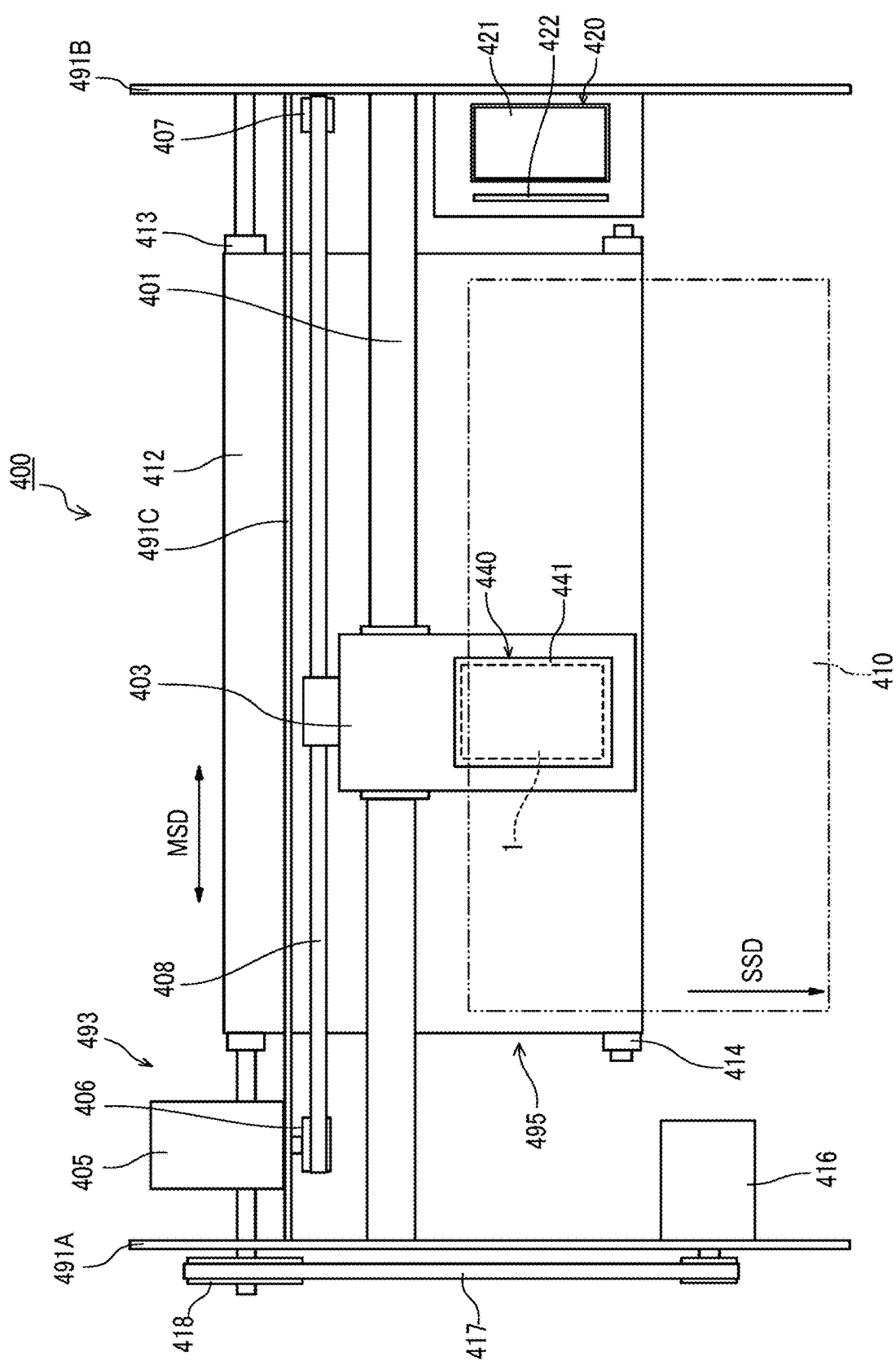
FIG. 25 is a schematic plan view of a portion of a printer as a liquid discharge apparatus according to an embodiment of the present disclosure.
Figure 26:
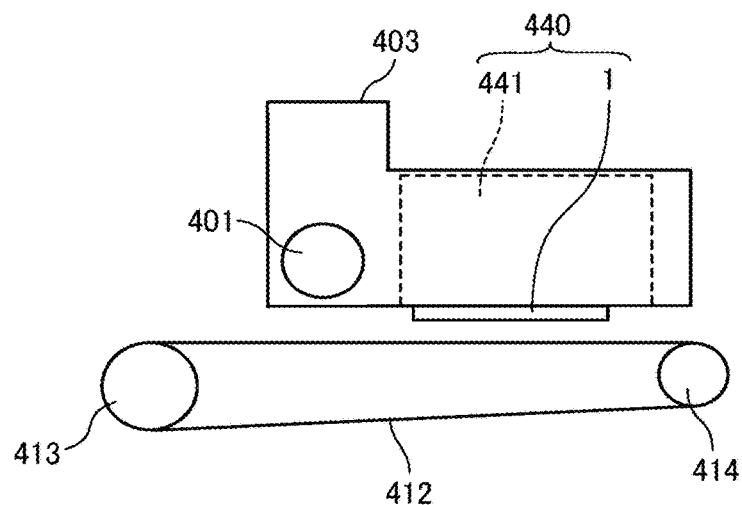
FIG. 26 is a schematic side view of a main portion of the liquid discharge apparatus of FIG. 25.

Next, an example of a printer 400 serving as a liquid discharge apparatus according to the present embodiment is described with reference to FIGS. 25 and 26. FIG. 25 is a schematic plan view of a portion of the printer 400. FIG. 26 is a schematic side view of a portion of the printer 400 of FIG. 25.

The printer 400 is a serial type apparatus, and a carriage 403 is reciprocally moved in a main scanning direction indicated by arrow "MSD" by a main scan moving unit 493. The main scan moving unit 493 includes a guide member 401, a main scanning motor 405, a timing belt 408, and the like. The guide member 401 is bridged between a left-side plate 491A and a right-side plate 491B and movably holds the carriage 403. The main scanning motor 405 reciprocally moves the carriage 403 in the main scanning direction MSD via the timing belt 408 bridged between a drive pulley 406 and a driven pulley 407.

The carriage 403 mounts a liquid discharge device 440. A head 1 and a head tank 441 forms the liquid discharge device 440 as a single unit. The head 1 has a configuration of one of the head 1 illustrated in FIGS. 1 to 24. The head 1 of the liquid discharge device 440 discharges liquid of each color, for example, yellow (Y), cyan (C), magenta (M), and black (K). The head 1 includes a nozzle array including a plurality of nozzles 11 arrayed in a sub-scanning direction as indicated by arrow "SSD" perpendicular to the main scanning direction MSD. The head 1 is mounted to the carriage 403 so that ink droplets are discharged downward.

The printer 400 includes a conveyor 495 to convey a sheet 410. The conveyor 495 includes a conveyance belt 412 as a conveyor and a sub-scanning motor 416 to drive the conveyance belt 412.

The conveyance belt 412 attracts the sheet 410 and conveys the sheet 410 at a position facing the head 1. The conveyance belt 412 is an endless belt and is stretched between a conveyance roller 413 and a tension roller 414. Attraction of the sheet 410 to the conveyance belt 412 may be applied by electrostatic adsorption, air suction, or the like.

The conveyance belt 412 rotates in the sub-scanning direction SSD as the conveyance roller 413 is rotationally driven by the sub-scanning motor 416 via the timing belt 417 and the timing pulley 418.

At one side in the main scanning direction MSD of the carriage 403, a maintenance unit 420 to maintain the head 1 in good condition is disposed on a lateral side of the conveyance belt 412.

The maintenance unit 420 includes, for example, a cap 421 to cap the nozzle surface of the head 1 and a wiper 422 to wipe the nozzle surface of the head 1.

The main scan moving unit 493, the maintenance unit 420, and the conveyor 495 are mounted to a housing that includes a left-side plate 491A, a right-side plate 491B, and a rear-side plate 491C.

In the printer 400 thus configured, the sheet 410 is conveyed on and attracted to the conveyance belt 412 and is conveyed in the sub-scanning direction SSD by the cyclic rotation of the conveyance belt 412.

The head 1 is driven in response to image signals while the carriage 403 moves in the main scanning direction MSD, to discharge liquid to the sheet 410 stopped, thus forming an image on the sheet 410.

Figure 27:
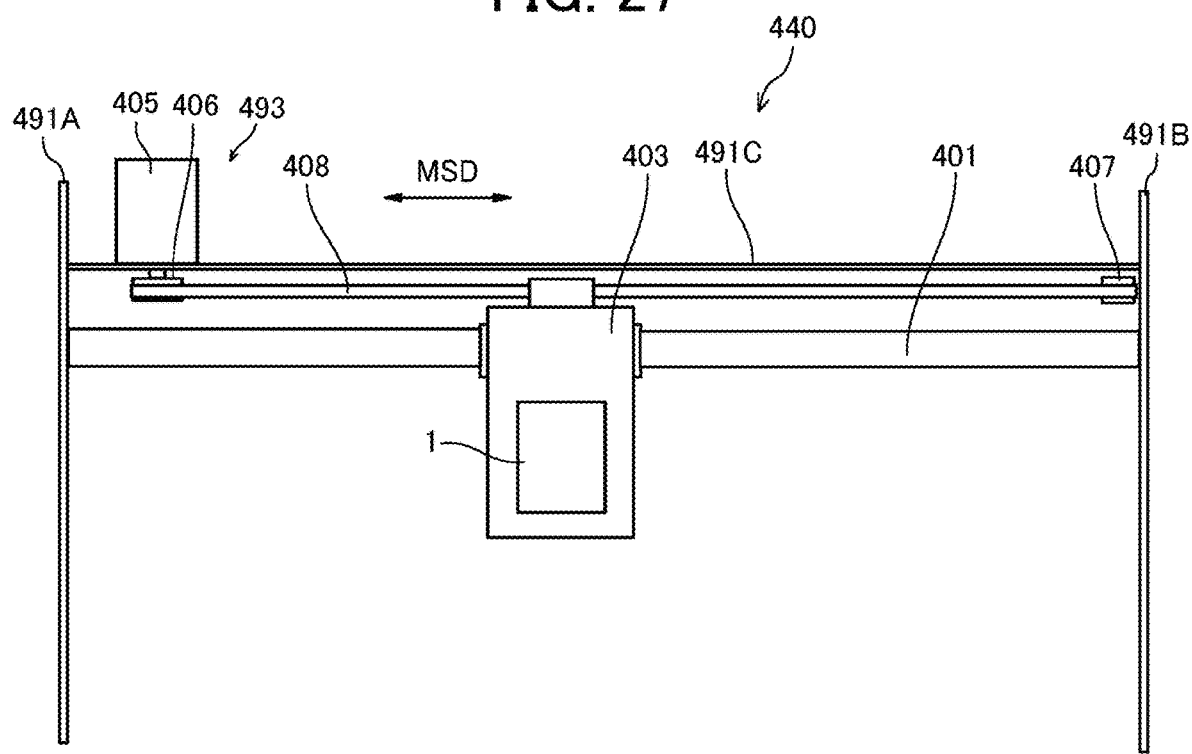
FIG. 27 is a schematic plan view of a portion of another example of a liquid discharge device according to an embodiment of the present disclosure.

Next, the liquid discharge device 440 according to another embodiment of the present disclosure is described with reference to FIG. 27. FIG. 27 is a schematic plan view of a portion of another example of the liquid discharge device 440.

The liquid discharge device 440 includes a housing including a left-side plate 491A, a right-side plate 491B, and a rear-side plate 491C, the main scan moving unit 493, the carriage 403, and the head 1 among components of the printer 400 (liquid discharge apparatus) illustrated in FIG. 25.

Note that, in the liquid discharge device 440, the maintenance unit 420 described above may be mounted on, for example, the right-side plate 491B.

Figure 28:
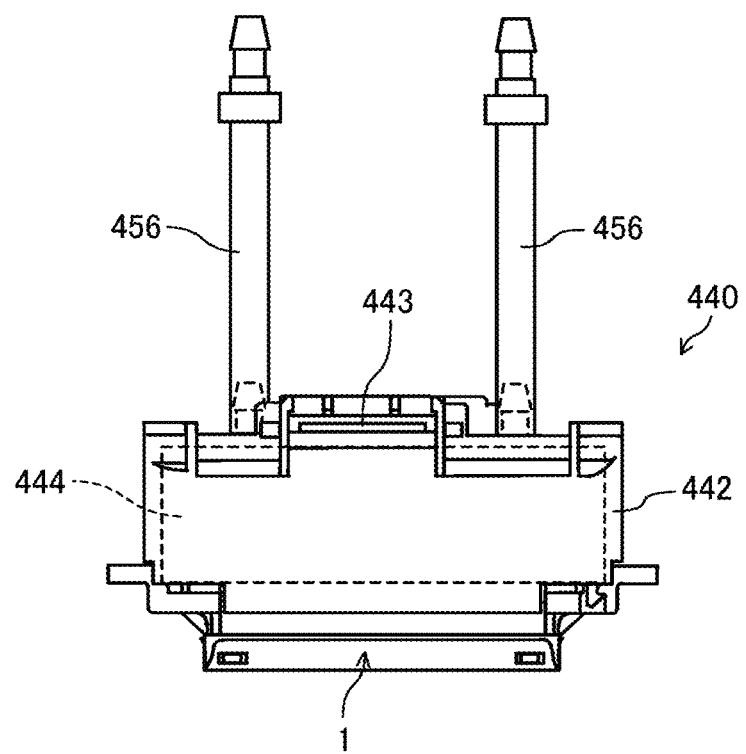
FIG. 28 is a schematic front view of still another example of the liquid discharge device according to an embodiment of the present disclosure.

Next, still another example of the liquid discharge device 440 according to still another example according to the present disclosure is described with reference to FIG. 28. FIG. 28 is a schematic front view of still another example of the liquid discharge device 440.

The liquid discharge device 440 includes the head 1, to which a channel part 444 is attached, and tubes 456 connected to the channel part 444.

Further, the channel part 444 is disposed inside a cover 442. Instead of the channel part 444, the liquid discharge device 440 may include the head tank 441. A connector 443 electrically connected with the head 1 is provided on an upper part of the channel part 444.

In the present embodiments, a "liquid" discharged from the head is not particularly limited as long as the liquid has a viscosity and surface tension of degrees dischargeable from the head. However, preferably, the viscosity of the liquid is not greater than 30 mPa s under ordinary temperature and ordinary pressure or by heating or cooling.

Examples of the liquid include a solution, a suspension, or an emulsion that contains, for example, a solvent, such as water or an organic solvent, a colorant, such as dye or pigment, a functional material, such as a polymerizable compound, a resin, or a surfactant, a biocompatible material, such as DNA, amino acid, protein, or calcium, or an edible material, such as a natural colorant.

Such a solution, a suspension, or an emulsion can be used for, e.g., inkjet ink, surface treatment solution, a liquid for forming components of electronic element or light-emitting element or a resist pattern of electronic circuit, or a material solution for three-dimensional fabrication.

Examples of an energy source to generate energy to discharge liquid include a piezoelectric actuator (a laminated piezoelectric element or a thin-film piezoelectric element), a thermal actuator that employs a thermoelectric conversion element, such as a heating resistor, and an electrostatic actuator including a diaphragm and opposed electrodes.

The "liquid discharge device" is an assembly of parts relating to liquid discharge. The term "liquid discharge device" represents a structure including the head and a functional part(s) or mechanism combined to the head to form a single unit. For example, the "liquid discharge device" includes a combination of the head with at least one of a head tank, a carriage, a supply unit, a maintenance unit, a main scan moving unit, and a liquid circulation apparatus.

Here, examples of the "single unit" include a combination in which the head and a functional part(s) or unit(s) are secured to each other through, e.g., fastening, bonding, or engaging, and a combination in which one of the head and a functional part(s) or unit(s) is movably held by another. The head may be detachably attached to the functional part(s) or unit(s) s each other.

For example, the head and the head tank may form the liquid discharge device as a single unit. Alternatively, the head and the head tank coupled (connected) with a tube or the like may form the liquid discharge device as a single unit. Here, a unit including a filter may further be added to a portion between the head tank and the head of the liquid discharge device.

In another example, the head and the carriage may form the liquid discharge device as a single unit.

In still another example, the liquid discharge device includes the head movably held by a guide that forms part of a main scan moving unit, so that the head and the main scan moving unit form a single unit. The liquid discharge device may include the head, the carriage, and the main scan moving unit that form a single unit.

In still another example, a cap that forms part of a maintenance unit may be secured to the carriage mounting the head so that the head, the carriage, and the maintenance unit form a single unit to form the liquid discharge device.

Further, in another example, the liquid discharge device includes tubes connected to the head mounting the head tank or the channel member so that the head and a supply unit form a single unit. Liquid is supplied from a liquid reservoir source to the head via the tube.

The main scan moving unit may be a guide only. The supply unit may be a tube(s) only or a loading unit only.

Here, the "liquid discharge device" may be a single unit in which the head and other functional parts are combined with each other. However, the "liquid discharge device" may include a head module including the above-described head, and a head device in which the above-described functional components and mechanisms are combined to form a single unit.

The term "liquid discharge apparatus" used herein also represents an apparatus including the head, the liquid discharge device, the head module, and the head device to discharge liquid by driving the head. The liquid discharge apparatus may be, for example, an apparatus capable of discharging liquid to a material to which liquid can adhere or an apparatus to discharge liquid toward gas or into liquid.

The "liquid discharge apparatus" may include devices to feed, convey, and eject the material onto which liquid can adhere. The liquid discharge apparatus may further include a pretreatment apparatus to coat a treatment liquid onto the material, and a post-treatment apparatus to coat a treatment liquid onto the material, onto which the liquid has been discharged.

The "liquid discharge apparatus" may be, for example, an image forming apparatus to form an image on a sheet by discharging ink, or a three-dimensional fabrication apparatus to discharge a fabrication liquid to a powder layer in which powder material is formed in layers to form a three-dimensional fabrication object.

The "liquid discharge apparatus" is not limited to an apparatus to discharge liquid to visualize meaningful images, such as letters or figures. For example, the liquid discharge apparatus may be an apparatus to form arbitrary images, such as arbitrary patterns, or fabricate three-dimensional images.

The above-described term "material onto which liquid can adhere" represents a material on which liquid is at least temporarily adhered, a material on which liquid is adhered and fixed, or a material into which liquid is adhered to permeate. Examples of the "material onto which liquid can adhere" include recording media, such as paper sheet, recording paper, recording sheet of paper, film, and cloth, electronic component, such as electronic substrate and piezoelectric element, and media, such as powder layer, organ model, and testing cell. The "material onto which liquid can adhere" includes any material on which liquid is adhered, unless particularly limited.

Examples of the "material onto which liquid can adhere" include any materials on which liquid can adhere even temporarily, such as paper, thread, fiber, fabric, leather, metal, plastic, glass, wood, and ceramic.

The "liquid discharge apparatus" may be an apparatus to relatively move the head and a material onto which liquid can adhere. However, the liquid discharge apparatus is not limited to such an apparatus. For example, the liquid discharge apparatus may be a serial head apparatus that moves the head or a line head apparatus that does not move the head.

Examples of the "liquid discharge apparatus" further include a treatment liquid coating apparatus to discharge a treatment liquid to a sheet to coat the treatment liquid on a sheet surface to reform the sheet surface, and an injection granulation apparatus in which a composition liquid including raw materials dispersed in a solution is injected through nozzles to granulate fine particles of the raw materials.

The terms "image formation", "recording", "printing", "image printing", and "fabricating" used herein may be used synonymously with each other.

Numerous additional modifications and variations are possible in light of the above teachings. It is therefore to be understood that, within the scope of the above teachings, the present disclosure may be practiced otherwise than as specifically described herein. With some embodiments having thus been described, it is obvious that the same may be varied in many ways. Such variations are not to be regarded as a departure from the scope of the present disclosure and appended claims, and all such modifications are intended to be included within the scope of the present disclosure and appended claims.

What is claimed is:

1. A liquid discharge head comprising:
a nozzle plate in which a nozzle is formed to discharge a liquid from the nozzle;
a first member bonded to the nozzle plate; and
a second member bonded to the first member with an adhesive in a bonding direction,
wherein the first member includes:
a bonding surface to be bonded to the second member in the bonding direction to define a liquid channel communicating with the nozzle; and
a surface portion lower than the bonding surface in the bonding direction to define a surface structure for evaluation of a bonding state between the first member and the second member, and
the surface portion of the first member is bonded to the second member with the adhesive in the bonding direction, and
the second member includes a through hole opposed to the surface portion of the first member; and
the through hole of the second member is separated from an opening in a planer direction perpendicular to the bonding direction, the opening communicating with the liquid channel in the first member.

2. The liquid discharge head according to claim 1,
wherein the surface portion includes:
a first surface lower than the bonding surface in the bonding direction; and
a second surface lower than the first surface in the bonding direction,
the first surface of the first member is bonded to the second member with the adhesive in the bonding direction, and
the second surface of the first member is not bonded to the second member with the adhesive.

3. The liquid discharge head according to claim 2,
wherein the first member includes a third surface lower than the first surface and higher than the second surface in the bonding direction, and
the third surface is bonded to the second member with the adhesive.

4. The liquid discharge head according to claim 3,
wherein the first member includes a fourth surface having a same height as the bonding surface of the first member in the bonding direction.

5. The liquid discharge head according to claim 2,
wherein the first surface and the second surface are arrayed in one line.

6. The liquid discharge head according to claim 2,
wherein the first member includes a bridge portion between the first surface and the second surface to connect the first surface and the second surface, and
a width of the bridge portion is narrower than a width of each of the first surface and the second surface.

7. The liquid discharge head according to claim 2,
wherein the second member includes an opposing surface portion applied with the adhesive,
the opposing surface portion is opposed to the surface portion of the first member.

8. The liquid discharge head according to claim 7,
wherein the opposing surface portion of the second member has a same height as the bonding surface of the first member.

9. The liquid discharge head according to claim 7,
wherein the opposing surface portion of the second member includes:
a first wide portion opposed to the first surface of the first member;
a second wide portion opposed to the second surface of the first member; and
a bridge portion between the first wide portion and the second wide portion to connect the first wide portion and the second wide portion, and
each of the first wide portion and the second wide portion is wider than the bridge portion.

10. The liquid discharge head according to claim 9,
wherein the opposing surface portion includes a recess lower than the first wide portion and the second wide portion in a periphery of the first wide portion and the second wide portion.

11. The liquid discharge head according to claim 9,
wherein the first wide portion and the second wide portion are arrayed in one line.

12. The liquid discharge head according to claim 9,
wherein each of the first wide portion and the second wide portion includes a through hole in a center of each of the first wide portion and the second wide portion.

13. The liquid discharge head according to claim 9,
wherein a width of the bridge portion is narrower than a width of each of the first wide portion and the second wide portion.

14. The liquid discharge head according to claim 9,
wherein the opposing surface portion of the second member includes an enclosure surrounding the first wide portion, the second wide portion, and the bridge portion, and
the enclosure includes a through hole.

15. The liquid discharge head according to claim 1,
wherein the surface portion of the first member is made of a same material as another component of the first member.

16. A liquid discharge device comprising the liquid discharge head according to claim 1.

17. A liquid discharge apparatus comprising the liquid discharge device according to claim 16.

* * * * *